US007764490B2

(12) United States Patent
Muraki

(10) Patent No.: US 7,764,490 B2
(45) Date of Patent: Jul. 27, 2010

(54) DISPLAY DEVICES AND IMAGE RECORDING APPARATUS COMPRISING THE SAME

(75) Inventor: Motohito Muraki, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 109 days.

(21) Appl. No.: 12/050,890

(22) Filed: Mar. 18, 2008

(65) Prior Publication Data

US 2008/0232050 A1 Sep. 25, 2008

(30) Foreign Application Priority Data

Mar. 19, 2007 (JP) ............................ 2007-071137

(51) Int. Cl.
*H05K 7/16* (2006.01)

(52) U.S. Cl. ........................... 361/679.21; 361/679.01; 361/679.22; 248/917

(58) Field of Classification Search ............ 361/679.06, 361/679.21, 679.22, 679.01; 248/917
See application file for complete search history.

(56) References Cited

U.S. PATENT DOCUMENTS 3,684,295 A * 8/1972 Strain et al. ................... 360/93
4,372,694 A * 2/1983 Bovio et al. ................... 400/88
6,744,623 B2 6/2004 Numano et al.
7,062,197 B2 * 6/2006 Kunugi ....................... 399/107
7,502,219 B2 * 3/2009 Kuga ..................... 361/679.22
2004/0228077 A1 * 11/2004 Hall et al. ................... 361/681
2008/0055829 A1 * 3/2008 Ko et al. ..................... 361/681

FOREIGN PATENT DOCUMENTS

JP H07-234645 A 9/1995
JP 2572761 Y2 3/1998
JP H10-63192 A 3/1998
JP 20021-4089 A 4/2002
JP 2003167525 A 6/2003

* cited by examiner

*Primary Examiner*—Jayprakash N Gandhi
*Assistant Examiner*—Ingrid Wright
(74) *Attorney, Agent, or Firm*—Baker Botts, LLP.

(57) ABSTRACT

A display device includes a rotary member having an eccentric cam formed therein, and a display panel unit including a shaft which engages a surface of the eccentric cam. The shaft is configured to selectively move within the eccentric cam, and the display panel unit is configured to rotate about an axis of rotation when the shaft moves within the eccentric cam. Moreover, the shaft is offset from the axis of rotation.

19 Claims, 8 Drawing Sheets

DISPLAY DEVICES AND IMAGE RECORDING APPARATUS COMPRISING THE SAME

CROSS-REFERENCE TO RELATED APPLICATION

The present application claims priority from Japanese Patent Application No. 2007-071137, which was filed on Mar. 19, 2007, the disclosure of which is incorporated herein by reference in its entirety.

BACKGROUND OF THE INVENTION

1. Field of the Invention

The present invention relates generally to display devices and image recording apparatus comprising the same.

2. Description of Related Art

A known image recording apparatus may be a single-function device, such as a printer, a copy machine, a facsimile machine, or a multi-function device configured to perform a plurality of functions, such as any combination of a printer function, a copier function, a scanner function, and a facsimile function. The known image recording apparatus includes and display panel which includes a crystal liquid panel. The known image recording apparatus also includes a mechanism configured to adjust a tilt angle of the display portion and to maintain a selected angle of the display portion.

The display panel is configured to be accommodated in a tray having an upwardly open structure when the display panel is in a horizontal position. The display panel includes a cam which is coaxial with a rotary shaft positioned at a base end of the display panel, and has recessed portions formed at its periphery at predetermined intervals. The tray includes a lever therein, which is rotatable about a shaft which is parallel to the rotary shaft and extends horizontally. A roller for locking the display panel in a selected position is positioned at an end of the lever. The lever is urged by a helical spring, such that the roller contacts the periphery of the cam. In this display panel, the roller of the lever readily moves between adjacent recessed portions, and a tilt angle of the display panel may be maintained when the urging force of the helical spring increases because the recessed portions of the cam have a sufficient depth for maintaining the angle of the display panel.

A known display unit includes a touch screen positioned at a front side of the display unit, and a tilt mechanism for the display unit. The tilt mechanism includes a base unit to which a bottom end of the display unit is rotatably supported by a shaft which extends horizontally. The base unit includes a stopper which protrudes from a rear face of the display unit. The stopper is configured to selectively engage and disengage from a rack formed at the base unit. An elastic member, such as a torsion spring, which presses the stopper against the rack, and a disengaging member, such as a push button, which releases the engagement between the stopper and the rack, is positioned at a side face of the stopper.

The known display panel and the known display unit are configured, such that a user adjusts the tilt angle by holding and rotating the display panel or the display unit. If, however, the user applies an excessive amount of force to the display panel or the display unit, or if the user rotates the display panel or the display unit too rapidly, the display panel or the display unit may be damaged. Moreover, the known display panel and the known display unit include a grasping portion positioned on a main body thereof, which the user uses to hold and to rotate the display panel or the display unit. Nevertheless, such a grasping portion increases the size of the display panel or the display unit.

SUMMARY OF THE INVENTION

Thus, a need has arisen for display devices and image recording apparatus comprising the same which overcome these and other shortcomings of the related art. A technical advantage of the present invention is that a display device comprises a mechanism configured to adjust a tilt angle of a display panel unit without a user having to hold and rotate the display panel unit.

According to an embodiment of the invention, a display device comprises a rotary member having an eccentric cam formed therein, and a display panel unit comprising a shaft which engages a surface of the eccentric cam. The shaft is configured to selectively move within the eccentric cam, and the display panel unit is configured to rotate about an axis of rotation when the shaft moves within the eccentric cam. Moreover, the shaft is offset from the axis of rotation.

According to another embodiment of the present invention, an image recording apparatus comprises a recording portion configured to form an image on a recording medium, and a display device. The display device comprises a rotary member having an eccentric cam formed therein, and a display panel unit comprising a shaft which engages a surface of the eccentric cam. The shaft is configured to selectively move within the eccentric cam, and the display panel unit is configured to rotate about an axis of rotation when the shaft moves within the eccentric cam. Moreover, the shaft is offset from the axis of rotation.

Other objects, features, and advantages of the invention will be understood by those skilled in the art from the following detailed description and accompanying drawings.

BRIEF DESCRIPTION OF THE DRAWINGS

For a more complete understanding of the present invention, the needs satisfied thereby, and the features and technical advantages thereof, reference now is made to the following descriptions taken in connection with the accompanying drawings.

DETAILED DESCRIPTION OF EMBODIMENTS

Embodiments of the present invention and their features and technical advantages may be understood by referring to FIGS. 1-8B, like numerals being used for like corresponding parts in the various drawings.

Figure 1:
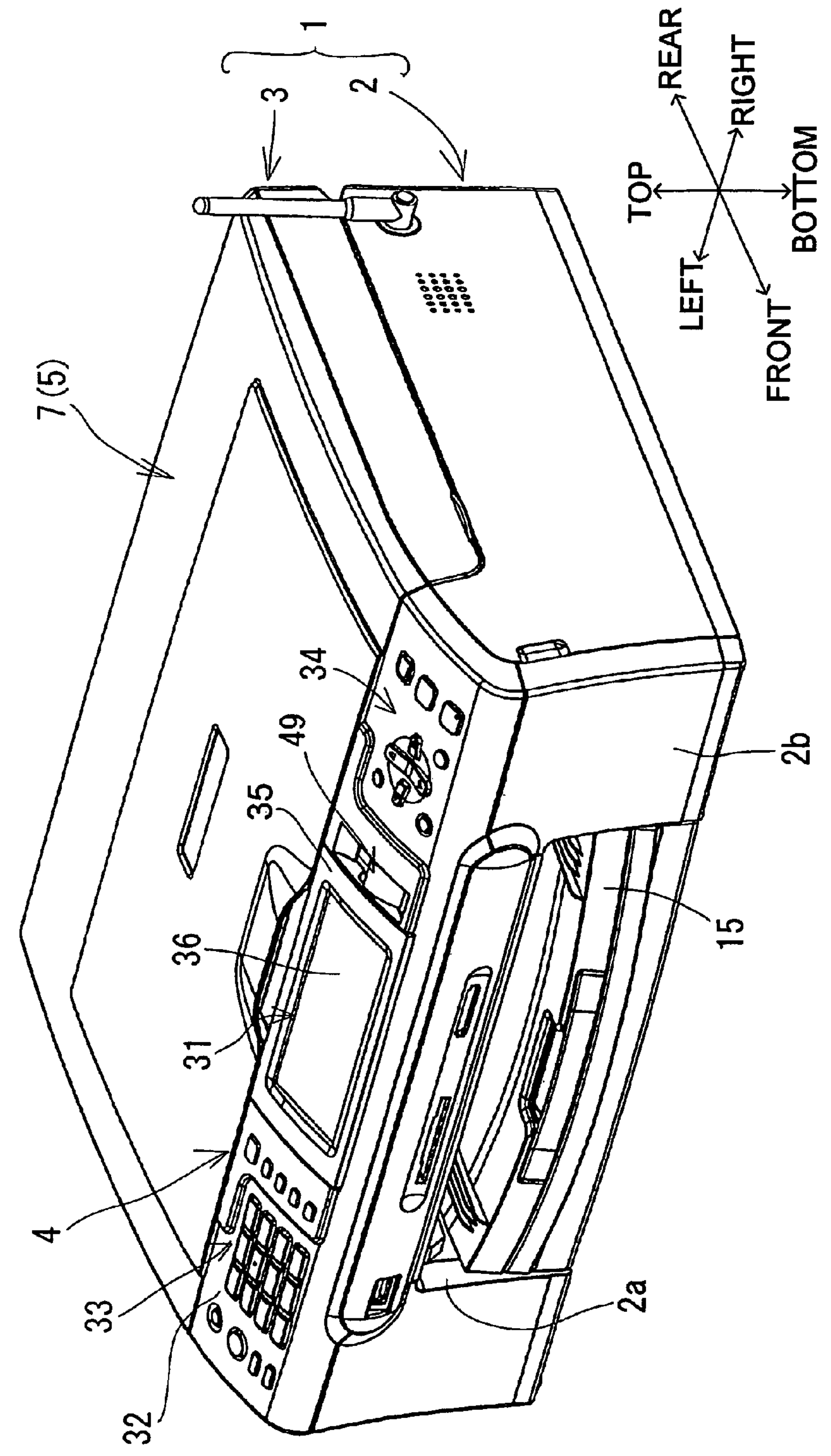
FIG. 1 is a perspective view of an image recording apparatus, according an embodiment of the present invention.

Referring to FIG. 1, an image recording apparatus 1 according to an embodiment of the present invention is depicted. For example, image recording apparatus 1 may be a multi-function device configured to perform a plurality of functions, such as any combination of a printer function, a copier function, a scanner function, and a facsimile function.

Image recording apparatus 1 may comprise a lower body 2, e.g., a housing, and an upper body 3, each of which may be injection molded and may comprise a synthetic resin. Upper body 3 may be positioned above lower body 2 and may be attached to lower body 2 via a pivot portion (not shown). Upper body 3 may be rotatable up and down to be selectively opened and closed with respect to lower body 2. Lower body 2 may have an opening 2*a* formed therethrough at a front face of lower body 2. The pivot portion may be positioned at a rear of lower body 2 at a position farthest from the opening 2*a*. The pivot portion may be a rotational axis of upper body 3 with respect to lower body 2. Image recording apparatus 1 may comprise an operating panel portion 4 positioned forward of a top face of lower body 2.

An image reader 5 may be built in upper body 3. Image reader 5 may be configured to perform the copier function and the facsimile function. Image reader 5 may comprise a glass plate 6, a document cover 7, and a contact image sensor 8. A document may be positioned on glass plate 6 by rotating document cover 7 upward. Contact image sensor 8 may be positioned under glass plate 6 to scan a document positioned on glass plate 6. Contact image sensor 8 is configured to reciprocate along a guide shaft 9 which extends in a direction perpendicular to a drawing sheet of FIG. 2. A rear end of document cover 7, which covers an upper face of image reader 5, may be attached to a rear end of upper body 3 via a hinge 10, such that the document cover 7 is rotatable up and down via the hinge 10.

Lower body 2 may comprise a door 2*b* at one side, e.g., the left side, of the front face thereof. Door 2*b* may be positioned to cover an ink storage portion, and may be openable toward the front. The ink storage portion may be configured to accommodate ink cartridges (not shown) which store different color inks therein, such as any combination of a black (Bk) ink cartridge, a cyan (C) ink cartridge, a magenta (M) ink cartridge, and a yellow (Y) ink cartridge. The ink cartridges may be connected to an inkjet recording head positioned in a recording portion 12 via flexible ink supply tubes.

Figure 2:
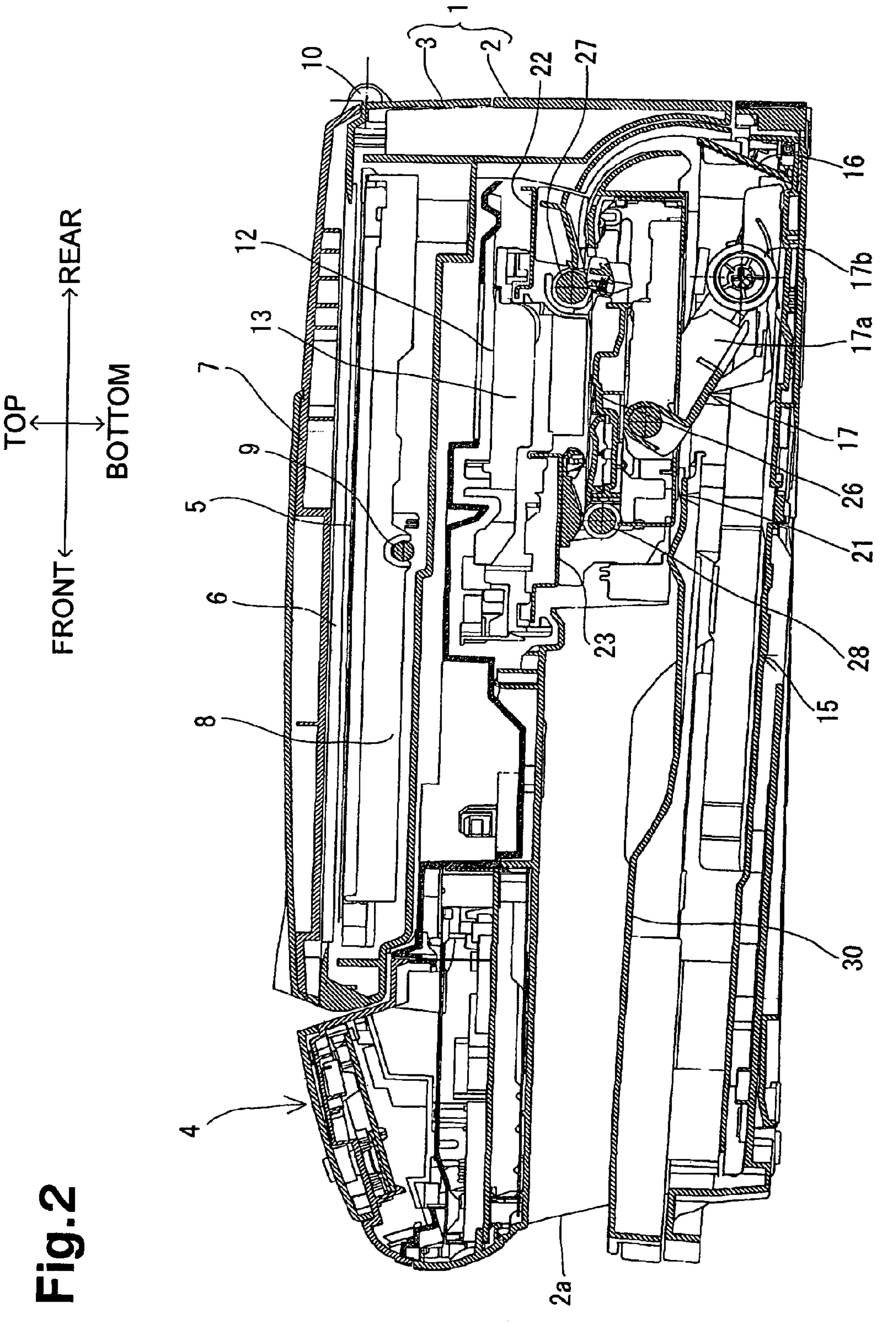
FIG. 2 is a sectional view of the image recording apparatus of FIG. 1.
Figure 3A:
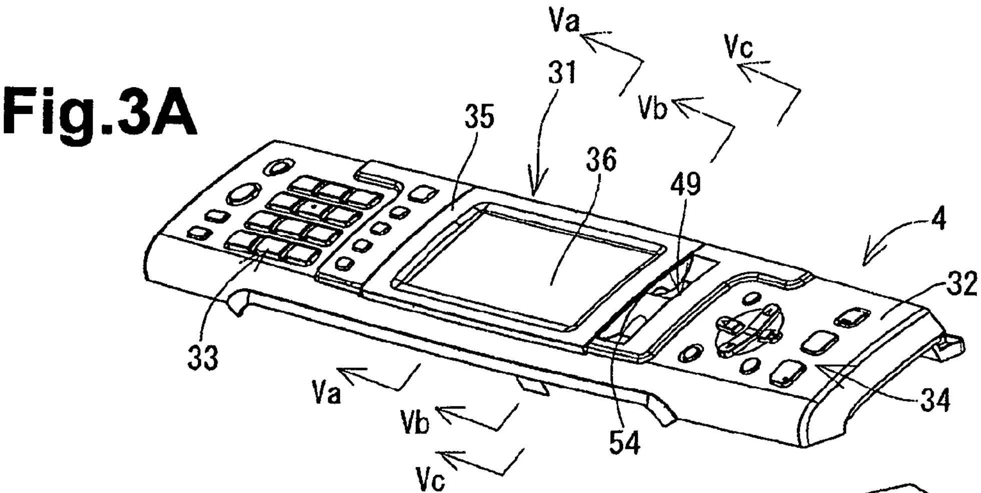
FIG. 3A is a front, perspective view of an operating panel portion, in which a display panel unit is located at a first position.
Figure 3B:
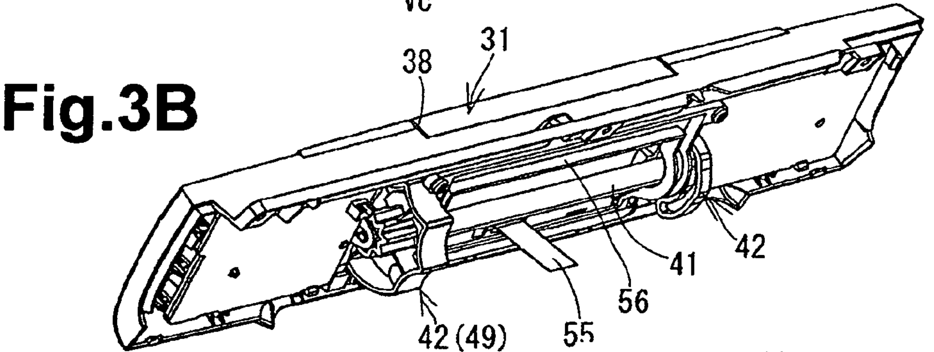
FIG. 3B is a rear, perspective view of the operating panel portion, in which the display panel unit is located at the first position.
Figure 3C:
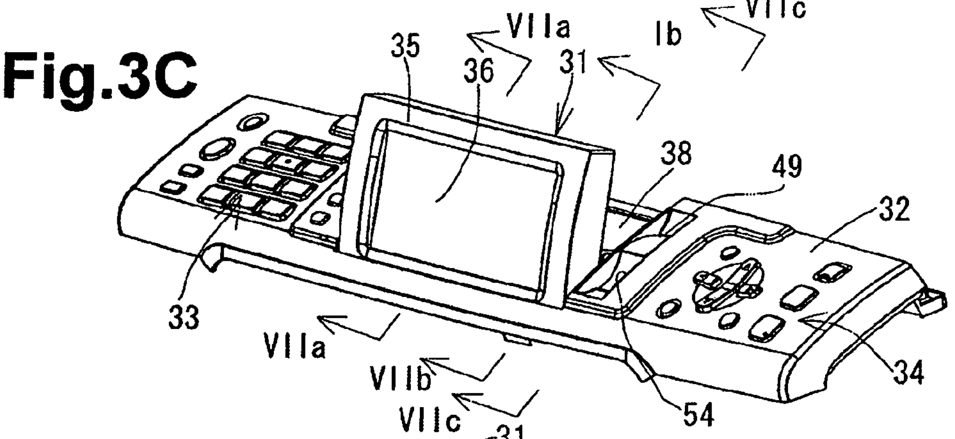
FIG. 3C is a front, perspective view of the operating panel portion in which the display panel unit is located at a second position.
Figure 3D:
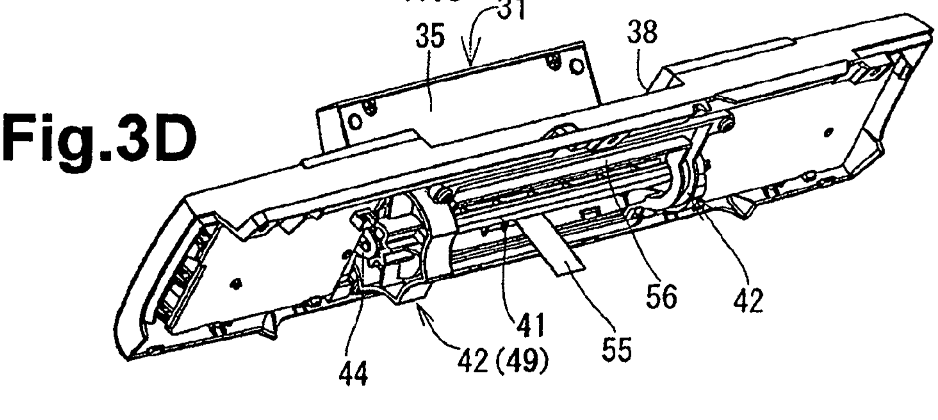
FIG. 3D is a rear, perspective view of the operating panel portion in which the display panel unit is located at the second position.
Figure 4A:
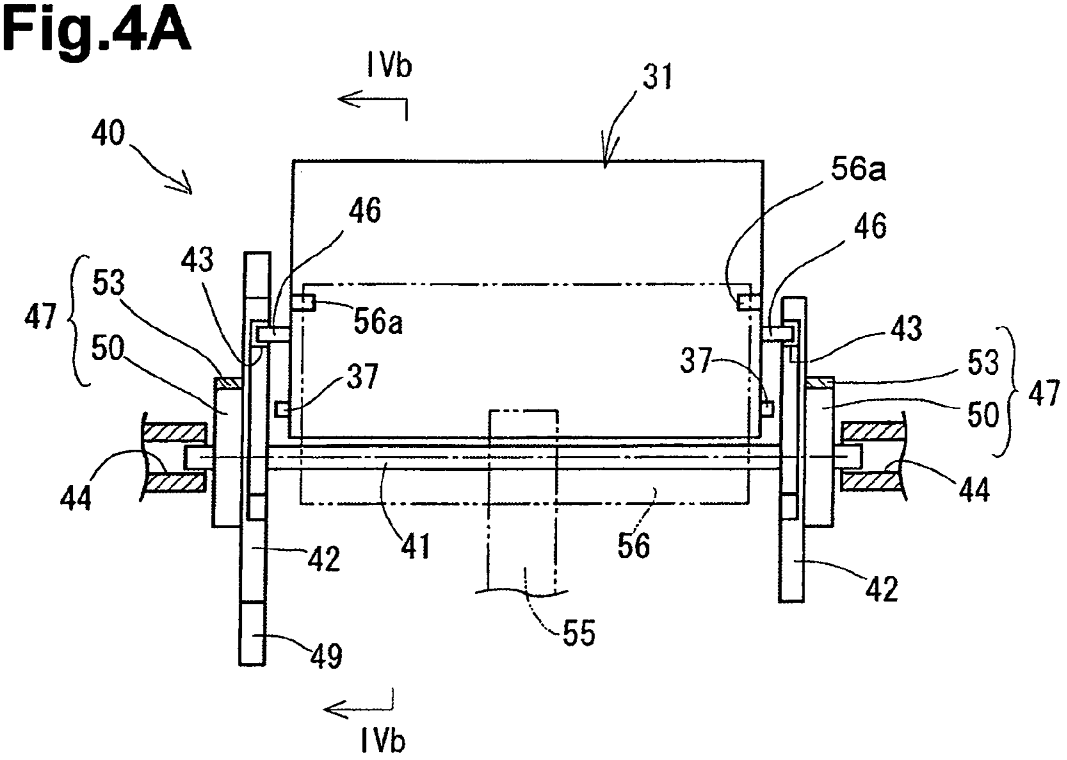
FIG. 4A is a rear view of the display panel unit located at the second position.
Figure 4B:
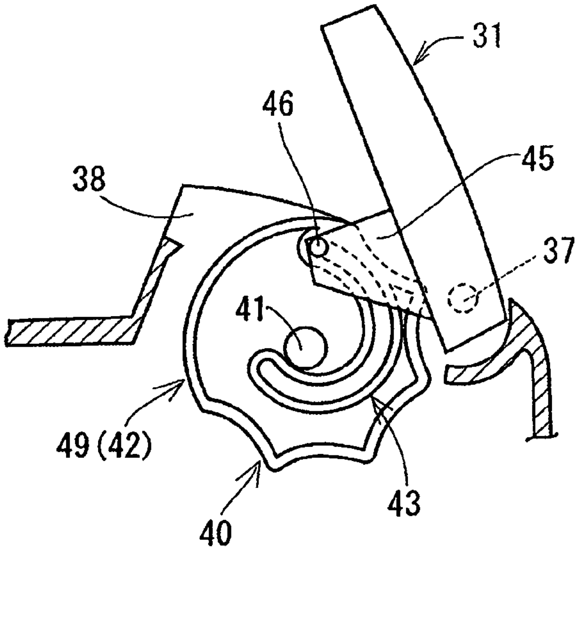
FIG. 4B is a sectional view of the display panel unit taken along a line IVb-IVb in FIG. 4A.

As shown in FIGS. 1 and 2, a sheet cassette 15 may be positioned at a bottom of lower body 2. Sheet cassette 15 may be configured to accommodate a stack of sheets therein, and to move in a front to rear direction of image recording apparatus 1 to be selectively installed in and removed from lower body 2. Sheet cassette 15 may be inserted into lower body 2 through the opening 2*a* from the front of image recording apparatus 1. Sheet cassette 15 may be configured to accommodate various sizes of sheets, such as A4-size sheets, letter-size sheets, legal-size sheets, postcard-size sheets, or the like.

A separating plate 16 may be positioned at an incline at the rear of sheet cassette 15 to separate a sheet from the stack of sheets. Separating plate 16 may comprise an elastic separating pad (not shown) having a toothed surface at a middle of separating plate 16 in a sheet width direction, so as to extend across separating plate 16 in its length direction. Separating plate 16 may be configured to contact leading edges of sheets to facilitate the separation of the sheet.

Lower body 2 also may comprise a sheet supply unit 17. Sheet supply unit 17 may comprise a sheet supply arm 17*a* and a sheet supply roller 17*b*. A base end of sheet supply arm 17*a* may be attached to lower body 2, such that the sheet supply arm 17*a* is rotatable in an up-down direction. The sheet supply roller 17*b* may be positioned at a free end of the sheet supply arm 17*a*. A rotational force may be transferred from a drive source to sheet supply roller 17*b* by a gear transmission mechanism positioned in the sheet supply arm 17*a*. Sheets stacked in sheet cassette 15 may be separated and supplied, one by one, by the sheet supply roller 17*b* and the separating pad of the separating plate 16. The separated sheet then may be fed to the recording portion 12, which may be positioned above sheet cassette 15, via a substantially-U shaped sheet conveying path.

As shown in FIG. 2, image recording apparatus 1 may comprise a box-shaped main frame 21 having a pair of side plates defining walls of the main frame 21. Recording portion 12 may be supported by main frame 21 and may be positioned between a first guide portion 22 and a second guide portion 23, which are elongated plates extending in a main scanning direction, i.e., a direction perpendicular to the drawing sheet of FIG. 2. First guide portion 22 and second guide portion 23 may be positioned upstream and downstream, respectively, from the recording portion 12 in a sheet conveying direction. A carriage 13 may extend between first guide member 22 and second guide member 23, and the inkjet recording head may be mounted at the bottom of carriage 13. Carriage 13 may be supported by first guide member 22 and second guide member 23, and may be movable therebetween, such that carriage 13 is configured to reciprocate in the main scanning direction.

A timing belt (not shown) may be positioned at a top surface of second guide member 23 in order to reciprocate carriage 13. The timing belt may extend in the main scanning direction. A movable adjusting member, such as a carriage motor (not shown), may be configured to drive the timing belt and may be fixed to a bottom surface of second guide member 23.

A flat platen 26 may be positioned between first guide member 22 and second guide member 23, and may be fixed to main frame 21. Platen 26 extends in the main scanning direction and faces a bottom face of the recording head of carriage 13.

A drive roller 27 and a nip roller may be positioned upstream of platen 26 in the sheet conveying direction. The nip roller may be positioned under drive roller 27. Drive roller 27 and the nip roller may function as conveyor rollers or register rollers configured to convey a sheet to a position under the recording head. A sheet discharge roller 28 and a spur roller may be positioned downstream of platen 26 in the sheet conveying direction. Sheet discharge roller 28 may be configured to be driven to convey the sheet, which has passed the recording portion 12, in the sheet conveying direction. The spur roller may be positioned to face sheet discharge roller 28, and may be urged toward sheet discharge roller 28.

A sheet discharge tray 30 may be positioned at a top of sheet cassette 15. A sheet on which recording is performed at recording portion 12 may be discharged onto sheet discharge tray 30 with a surface having an image formed thereon facing upward. A sheet discharge port may be formed in lower body 2 and may be in communication with sheet discharge tray 30. The sheet discharge port may be a common opening with opening 2*a* formed in lower body 2.

Referring to FIGS. 1 and 3A-8B, a display panel unit 31 according to an embodiment of the present invention is depicted. Display panel unit 31 may comprise a face plate 32 comprising a synthetic resin. Display panel unit 31 also may comprise a numeric keypad portion 33 positioned at the left portion of face plate 32, and an enter key portion 34 positioned at the right portion of face plate 32. Enter key portion 34 may comprise a plurality of keys having different functions through which a user may command various functions for image recording apparatus 1 to perform. For example, enter key portion 34 may comprise a start/stop key, a color copy start key, and a monochrome copy start key, which may be aligned in a line. Other enter keys to be used to search a predetermined facsimile number or control the sound volume of a handset, are in cross arrangement at the left of the start keys.

Display panel unit 31 may comprise a frame 35 and a display portion 36 comprising a liquid crystal display. Display portion 36 may be positioned in the front side of frame 35, and may be configured to display an image in color. Display portion 36 may have a relatively large screen, e.g., about 42 mm by 54 mm. Frame 35 may comprise shafts 37 protruding from lower portions of right and left sides of frame 35, respectively. Bearings (not shown) may be positioned in right and left walls of walls defining an accommodating portion 38, which is a recessed portion formed in a middle of the face plate 32 of the operating panel portion 4 in a width direction of the face plate 32. Shafts 37 may be supported by the bearings, such that frame 35 is pivotable.

Display panel unit 31 may be configured, such that its tilt angle is adjustable to any angle at predetermined intervals between a first position in which a screen surface of display portion 36 extends in substantially the same plane as a top surface of front plate 32 extends, and a second position in which display portion 36 is tilted up from the first position, such that the screen surface is inclined with respect to the top surface of front plate 32, e.g., display portion 36 may tilt about 60 degrees with respect to the horizontal plane. Thus, display panel unit 31 offers several tilt positions.

Display panel unit 31 also may comprise a tilt adjusting mechanism 40. Tilt adjusting mechanism 40 may comprise a support shaft 41, a pair of rotary members 42, shafts 46, latch devices 47, and a rotary dial 49. Each rotary member 42 may have an eccentric cam 43 formed therein. Support shaft 41 may be supported by bearings 44, which are positioned at the rear of front plate 32, at both ends, so as to be rotatable. Rotary members 42 may be fixed to support shaft 41 so as to be rotatable with support shaft 41. Eccentric cam 43 may be formed in one side of each rotary member 42. Shafts 46 may protrude from respective brackets 45 extending from the rear face of frame 35, and may engage a respective eccentric cam 43 so as to be slidable within respective eccentric cam 43. Latch device 47 may be positioned at the other side of each rotary member 42 which is an opposite side on which eccentric cam 43 is formed. One of rotary members 42 may comprise rotary dial 49 at its periphery.

Figure 5A:
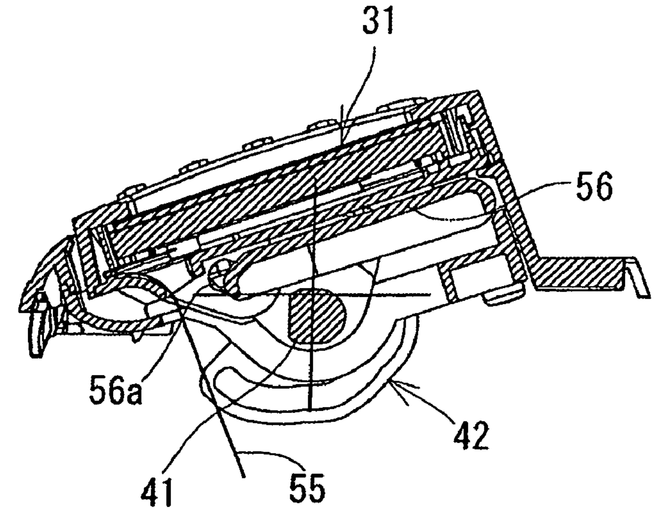
FIG. 5A is a sectional view of the display panel unit taken along a line Va-Va in FIG. 3A.
Figure 5B:
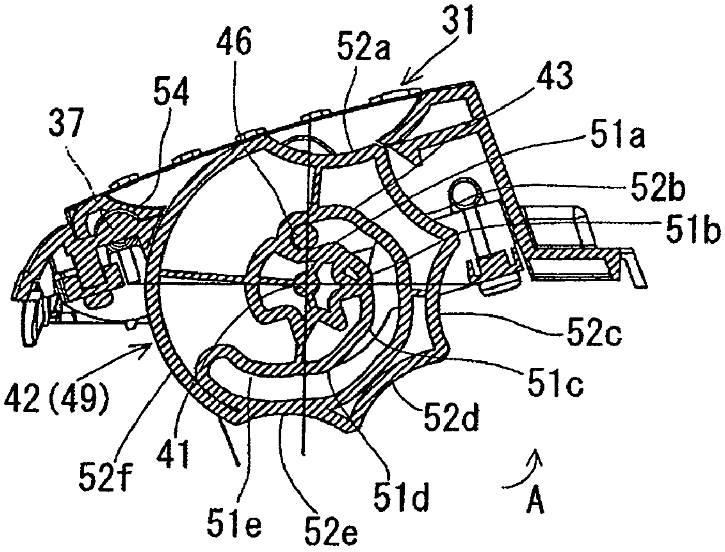
FIG. 5B is a sectional view of the display panel unit taken along a line Vb-Vb in FIG. 3A.
Figure 5C:
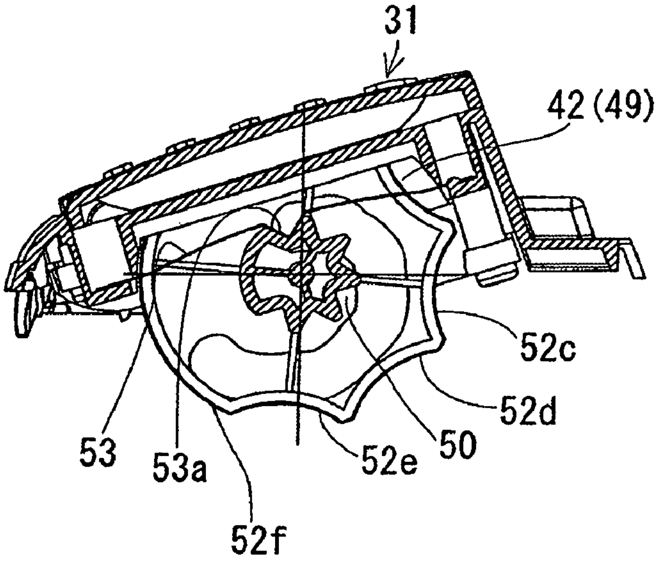
FIG. 5C is a sectional view of the display panel unit taken along a line Vc-Vc in FIG. 3A.
Figure 6A:
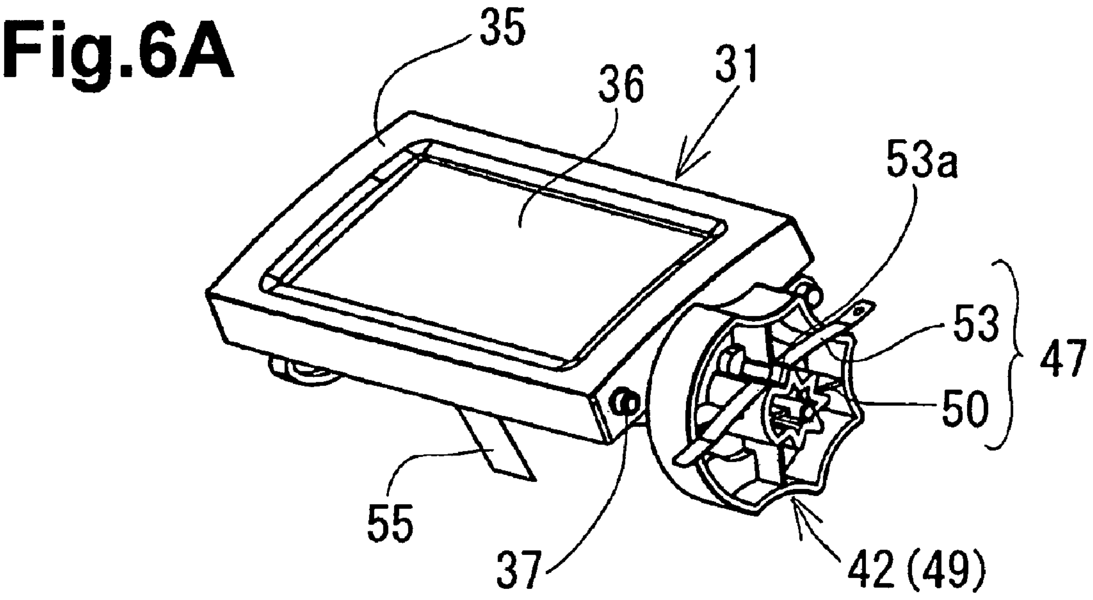
FIG. 6A is a front, perspective view of the display panel unit located at the first position, and a rotary dial.
Figure 6B:
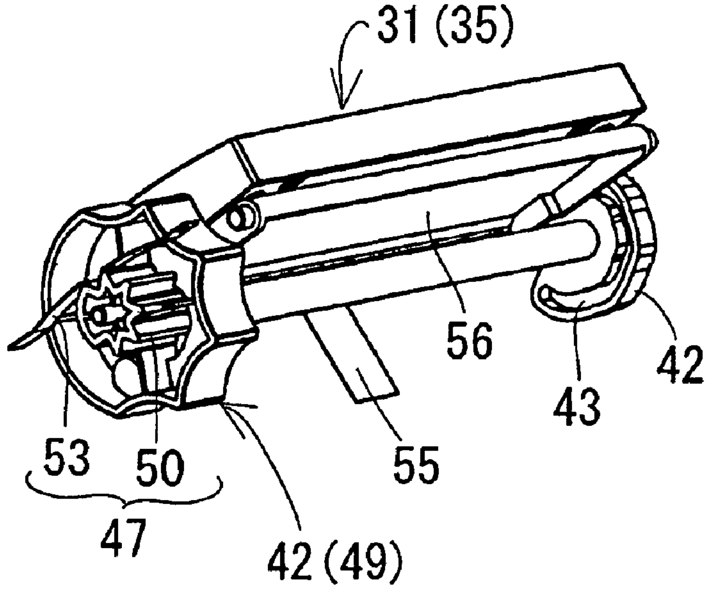
FIG. 6B is a rear perspective view of the display panel unit located at the first position, and the rotary dial.
Figure 7A:
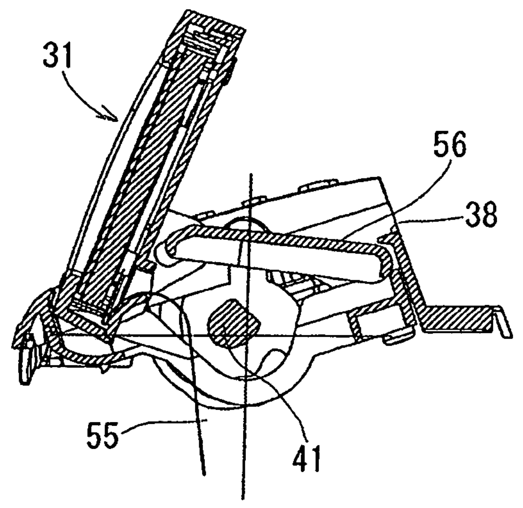
FIG. 7A is a sectional view of the display panel unit taken along a line VIIa-VIIa in FIG. 3C.
Figure 7B:
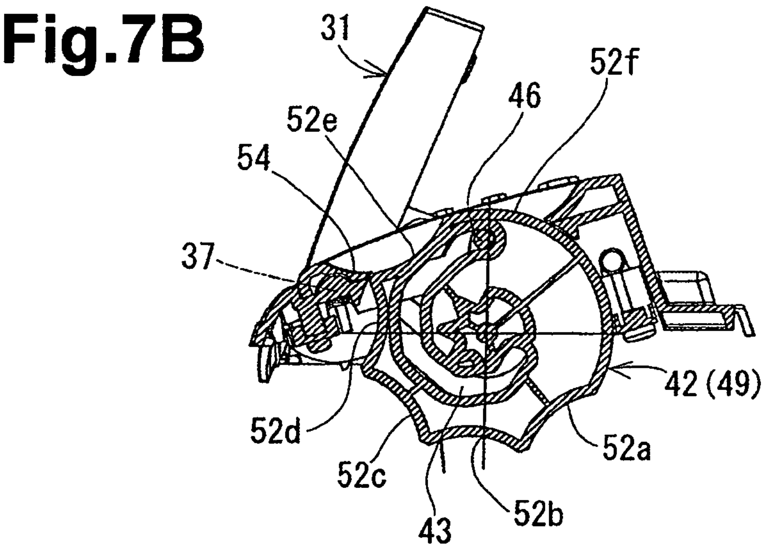
FIG. 7B is a sectional view of the display panel unit taken along a line VIIb-VIIb in FIG. 3C.
Figure 7C:
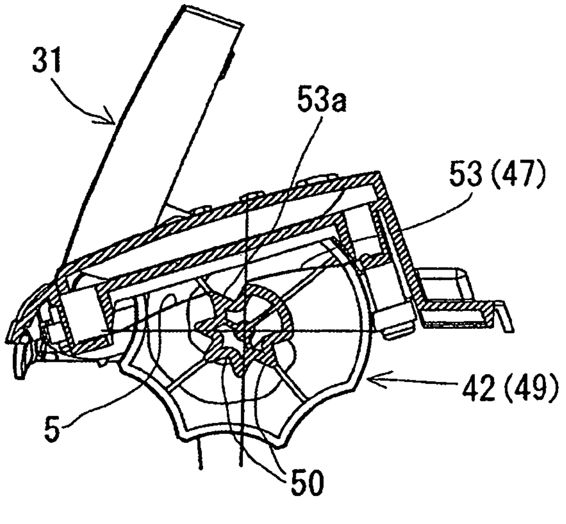
FIG. 7C is a sectional view of the display panel unit taken along a line VIIc-VIIc in FIG. 3C.
Figure 8A:
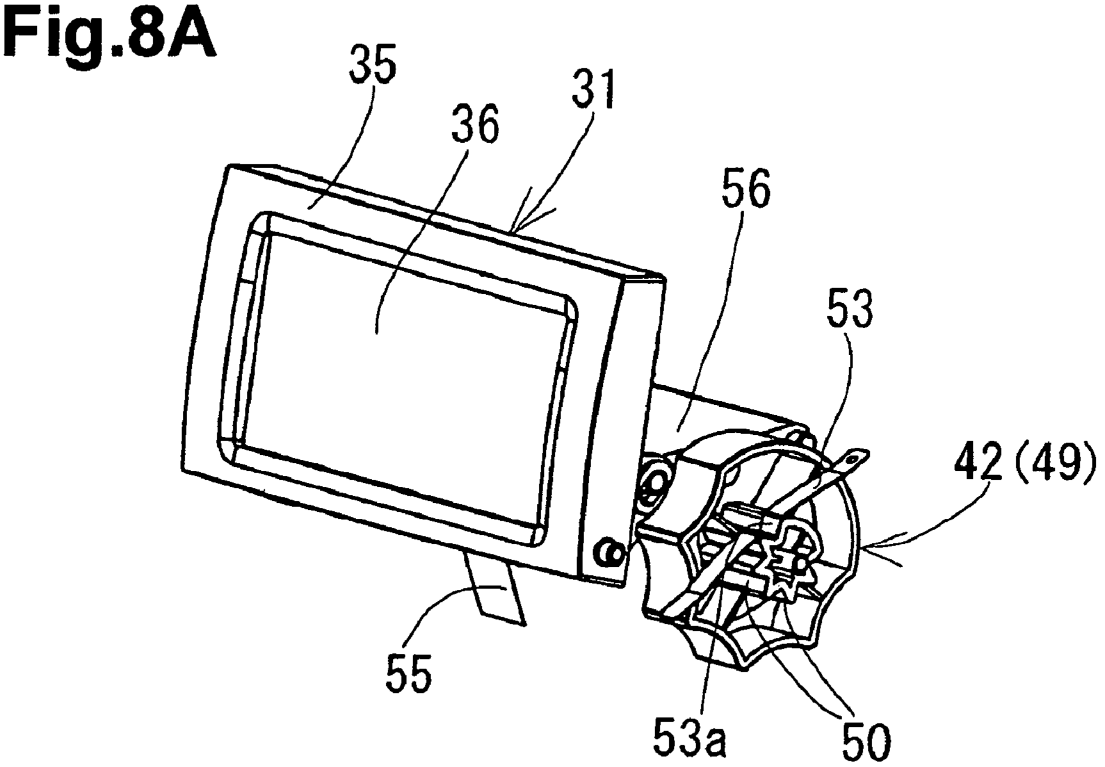
FIG. 8A is a front, perspective view of the display panel unit located at the second position, and the rotary dial.
Figure 8B:
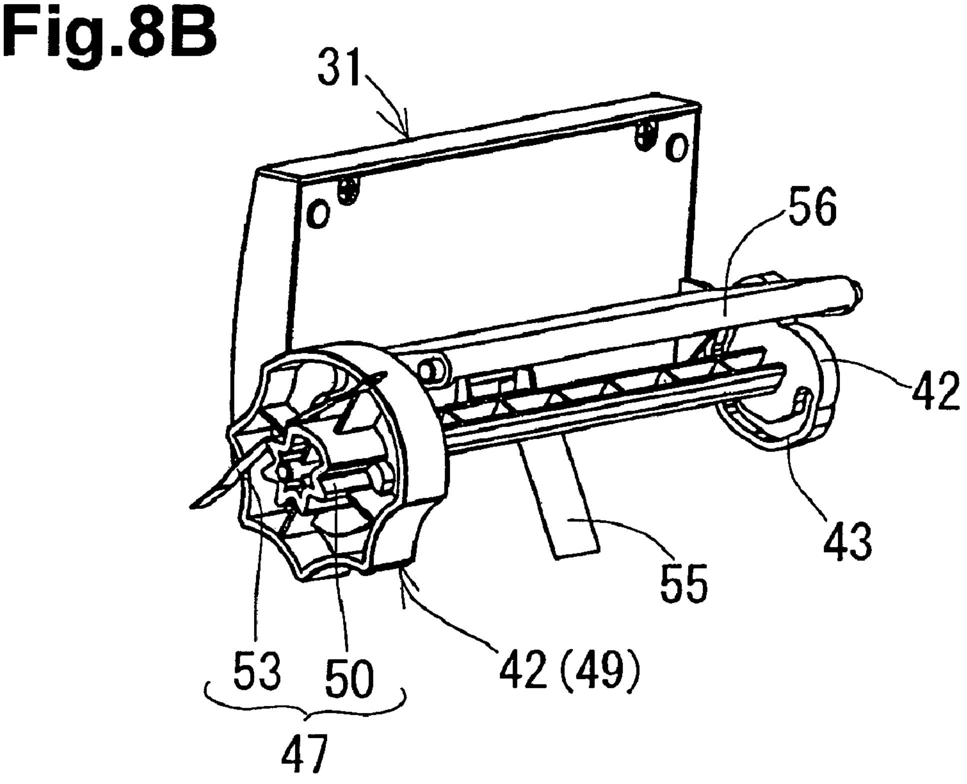
FIG. 8B is a rear, perspective view of the display panel unit located at the second position, and the rotary dial.

As shown in FIGS. 5B, 6A and 6B, one of rotary members 42, e.g., a right rotary member 42, eccentric cam 43, an engaging portion 50 of latch device 47, and rotary dial 49 may comprise a synthetic resin, and may be integral with each other. Engaging portion 50 may have a plurality of projections extending therefrom. The other of rotary members 42, e.g., a left rotary member 42, may be substantially similar to right rotary member 42, except it may not comprise rotary dial 49. Thus, right and left rotary members 42 may be symmetrical with respect to each other.

Each eccentric cam 43 may have a substantially spiral shape, and the radius of eccentric cam 43 gradually may increase with rotary member 42 rotating in a direction indicated by an arrow A (see FIG. 5B) from a smaller-radius portion adjacent to a center of rotation of rotary member 42. Eccentric cam 43 may comprise a plurality of e.g., five, projections 51*a*-51*e* formed at an inside-diameter portion thereof. For example, projections 51-51*e* may be spaced about every 45 degrees with respect to a center angle of eccentric cam 43. Each eccentric cam 43 may have a plurality of, e.g., six, stable zones. For example, each eccentric cam 43 may have a first stable zone which is defined between projection 51*a* and projection 51*b* and has a radius of R1, a second stable zone which is defined between projection 51*b* and projection 51*c* and has a radius of R2 which is greater than R1, a third stable zone which is defined between projection 51*c* and projection 51*d* and has a radius of R3 which is greater than R2, a fourth stable zone which is defined between projection 51*d* and projection 51*e* and has a radius of R4 which is greater than R3, a fifth stable zone which is defined between projection 51*e* and one end of eccentric cam 43 and has a radius of R5 which is greater than R4, and a sixth stable zone which is defined between the other end of eccentric cam 43 and projection 51*a* and has a radius of R0 which is the smallest radius. When rotary members 42 rotate in the direction indicated by arrow A or in its opposite direction, shafts 46 successively move from a stable zone to an adjacent stable zone. When shafts 46 are positioned within a stable zone, the stable zone prevents rotary members 42 from readily rotating in the direction indicated by arrow A and its opposite direction. Right rotary member 42 including rotary dial 49 may have a plurality of, e.g., five, recessed portions 52*a*-52*e* at its periphery at positions corresponding to the respective stable zones other than the fifth stable zone. Right rotary member 42 also may comprise an arc-shaped portion 52*f* at its periphery at a position corresponding to the fifth stable zone. The periphery of rotary dial 49 may be partially exposed from front plate 32 through an opening 54 formed adjacent to frame 35 in front plate 32. With this structure, the user may adjust the tilt angle of display panel unit 31 between the first position and the second position by rotating rotary dial 49 without holding frame 35. As described above, display panel unit 31 may offer six positions between the first position and the second position. Each eccentric cam 43 may comprise projections 51*a*-51*e* at predetermined intervals to apply resistance to shafts 46 when shafts 46 pass over each of projections 51*a*-51*e*. Accordingly, display panel unit 31 is prevented from undesirably rotate, e.g., pivot, even when a force is applied to display portion 36 by the user touching the touch screen of display portion 36.

Right rotary member 42 may comprise engaging portion 50 formed at the other side thereof, which is an opposite side in which eccentric cam 43 is formed. Projections of engaging portion 50 are formed at positions corresponding to the six respective stable zones. Latch device 47 also may comprise a leaf spring 53 having a protruding portion 53*a*. When protruding portion 53*a* of leaf spring 53 engages a recess defined by adjacent projections of engaging portion 50, rotary member 42 is prevented from rotating and is maintained in its position. When the user rotates rotary member 42, the user may feel a resistance in rotary member 42 due to the resistance caused when protruding portion 53*a* passes over each projection of engaging portion 50 against the urging force from leaf spring 53.

Latch devices 47 may be positioned at the respective positions shifted from the rotational axis of shafts 37 of frame 35, such that display panel unit 31 does not rotate even if a force is applied on display portion 36 by the user touching the touch screen of display portion 36.

A harness 55 may be positioned so as to protrude from the rear face of frame 35. Harness 55 may be positioned in the accommodating portion 38 to transfer a signal from lower body 2 to display portion 36. A cover 56 may be attached to the rear face of frame 35 via a shaft 56*a* to cover an upper surface of harness 55. Cover 56 may be configured to be rotatable with respect to frame 35. With this structure, harness 55 may be covered by cover 56 at all times even when display panel unit 31 is tilted upward from the first position. Accordingly, harness 55 is prevented from being touched by the user.

Rotary member 42 and rotary dial 49 may be integral or separate members. When they are separate members, one of rotary members 42 may be positioned at the rear face of frame 35, and rotary dial 49 may be positioned at one side of frame 35. A gear may be sandwiched between rotary member 42 and rotary dial 49, and rotary member 42 and rotary dial 49 may not be coaxial with each other.

In another embodiment of the present invention, one end of cover 56 and one end of frame 35 may be connected by a pin via a slit, and the other end of cover 56 may be supported to be rotatable within accommodating portion 38. Shafts 46 may be positioned to protrude from a middle of cover 56 in a length direction of cover 56, and may be configured to engage respective eccentric cam 43 of rotary members 42 so as to be slidable within eccentric cam 43. Latch devices 47 may comprise components other than leaf spring 53 and engaging portions 50.

Rotary members may be configured to rotate in the normal direction and the reverse direction by a motor (not shown), such that a user may adjust a tilt angle of a display panel unit by a switch operation.

In yet another embodiment of the present invention, a display device may comprise a latch device configured to offer a plurality of tilt positions of a rotary member at predetermined intervals. Thus, a display panel unit may be securely maintained at a desired position. In addition, the display panel unit may be further prevented from rotating even when the display panel comprises a touch screen.

According to still yet another embodiment of the present invention, the rotary member may be rotated in the normal direction and in its opposite direction by the motor. Thus, the tilt angle of the display panel unit readily may be adjusted.

According to a further embodiment of the present invention, the display device may comprise a cover which is positioned at a rear face of the display panel unit, and is configured to be rotatable and cover a harness connected to the display panel unit. Thus, the rotary member may be rotated in conjunction with rotation of the cover.

According to a still further embodiment of the present invention, the display panel may tilt at any angle with respect to a top face of an image recording apparatus. With this structure, the tilt angle of a screen of the display panel unit may be adjusted, such that the screen displays a quality contrast image for the user, which increases viewability. This structure also provides a legible display panel unit when an operator performs maintenance while pressing keys having different functions.

The invention may be also applied to a simple-function type image recording apparatus, or to display panel for a car navigation system.

While the features herein have been described in connection with various example structures and illustrative aspects, it will be understood by those skilled in the art that other variations and modifications of the structures and aspects described above may be made without departing from the scope of the invention. Other structures and aspects will be apparent to those skilled in the art from a consideration of the specification or practice of the features disclosed herein. It is intended that the specification and the described examples only are illustrative with the true scope of the inventions being defined by the following claims.

What is claimed is:

1. A display device comprising:

a rotary member comprising an eccentric cam formed therein; and a display panel unit comprising a display surface on which an image is displayed and a shaft which engages a surface of the eccentric cam, wherein the shaft selectively moves along the surface of the eccentric cam, and the display panel unit rotates about an axis of rotation in response to a movement of the shaft guided by the eccentric cam, wherein the shaft is offset from the axis of rotation.

2. The display device of claim 1, wherein the display panel unit further comprises a panel portion and a connecting portion that connects the panel portion to the shaft.

3. The display device of claim 1, further comprising a movable adjusting member which directly or indirectly rotates the rotary member.

4. The display device of claim 3, wherein the rotary member and the movable adjusting member are integral.

5. The display device of claim 3, wherein the rotary member and the movable adjusting member are coaxial.

6. The display device of claim 3, wherein a portion of the movable adjusting member is exposed to an exterior of the display device.

7. The display device of claim 1, wherein the eccentric cam comprises a groove, and the surface of the eccentric cam is an inner perimeter of the groove.

8. The display device of claim 1, further comprising a latch device that allows the rotary member to rotate between a plurality of tilt positions at predetermined intervals.

9. The display device of claim 8, wherein the latch device comprises:

a plurality of engaging portions; and a leaf spring which engages one of the plurality of engaging portions.

10. The display device of claim 9, wherein each of the plurality of engaging portions is concave, and the leaf spring comprises a protruding portion which engages one of the plurality of engaging portions.

11. The display device of claim 1, further comprising a main body, wherein the display panel unit rotates between a first position in which the display panel unit lies substantially flat relative to a particular surface of the main body and a second position in which the display panel unit is tilted up relative to the particular surface of the main body.

12. The display device of claim 11, wherein the shaft is positioned lower than the display surface of the display panel unit at the first position.

13. The display device of claim 1, wherein the axis of rotation is parallel to the display surface.

14. The display device of claim 1, wherein the shaft is parallel to the display surface.

15. The display device of claim 6, wherein the rotary member has a plurality of concaves arranged along a surface of the rotary member.

16. An image recording apparatus comprising:

a recording portion that forms an image on a recording medium; and a display device comprising:

a rotary member comprising an eccentric cam formed therein; and a display panel unit comprising a display surface on which an image is displayed and a shaft which engages a surface of the eccentric cam, wherein the shaft is configured to selectively moves along the engaged surface of the eccentric cam, and the display panel unit rotates about an axis of rotation in response to a movement of the shaft guided by the eccentric cam, wherein the shaft is offset from the axis of rotation.

17. The image recording apparatus of claim 16, wherein the display device further comprises a movable adjusting member which directly or indirectly rotates the rotary member.

18. The image recording apparatus of claim 17, wherein a portion of the movable adjusting member is exposed to an exterior of the image recording apparatus.

19. The image recording apparatus of claim 16, wherein the display device further comprises a main body, and the display panel unit rotates between a first position in which the display panel lies substantially flat relative to a particular surface of the main body and a second position in which the display panel unit is tilted up relative to the particular surface of the main body.

* * * * *